United States Patent [19]

Henry et al.

[11] Patent Number: 4,571,559

[45] Date of Patent: Feb. 18, 1986

[54] HIGH-POWER WAVEGUIDE LIMITER COMPRISING PIN DIODES FOR MILLIMETER WAVES

[75] Inventors: Raymond Henry, Fontenay aux Roses; Michel Heitzmann, Combs la Ville; Jean V. Bouvet, Creteil, all of France

[73] Assignee: Thomson-CSF, Paris, France

[21] Appl. No.: 659,844

[22] Filed: Oct. 11, 1984

[30] Foreign Application Priority Data

Oct. 14, 1983 [FR] France ............................ 83 16388

[51] Int. Cl.⁴ .............................................. H01P 1/22
[52] U.S. Cl. .................................. 333/17 L; 333/250; 357/55; 357/58
[58] Field of Search ................ 333/17 L, 250; 357/55, 357/58

[56] References Cited

U.S. PATENT DOCUMENTS 3,750,055  7/1973  Funck .............................. 357/58 X

OTHER PUBLICATIONS

Microwave Journal, vol. 22, No. 8, Aug. 1979, Dedham (US) E. P. Valkenburg et al.: pp. 59–64, FIG. 1.
Microwave Journal, vol. 26, No. 3, Mar. 1983, Dedham (US) A. Armstrong et al., pp. 65–72, FIG. 2.

Primary Examiner—Paul Gensler
Attorney, Agent, or Firm—Oblon, Fisher, Spivak, McClelland & Maier

[57] ABSTRACT

A high-power limiter comprising silicon PIN diodes for millimeter waves is formed by a waveguide associated with a silicon substrate wherein is formed a matrix of PIN diodes. The PIN diodes are formed throughout the thickness of the silicon substrate.

5 Claims, 11 Drawing Figures

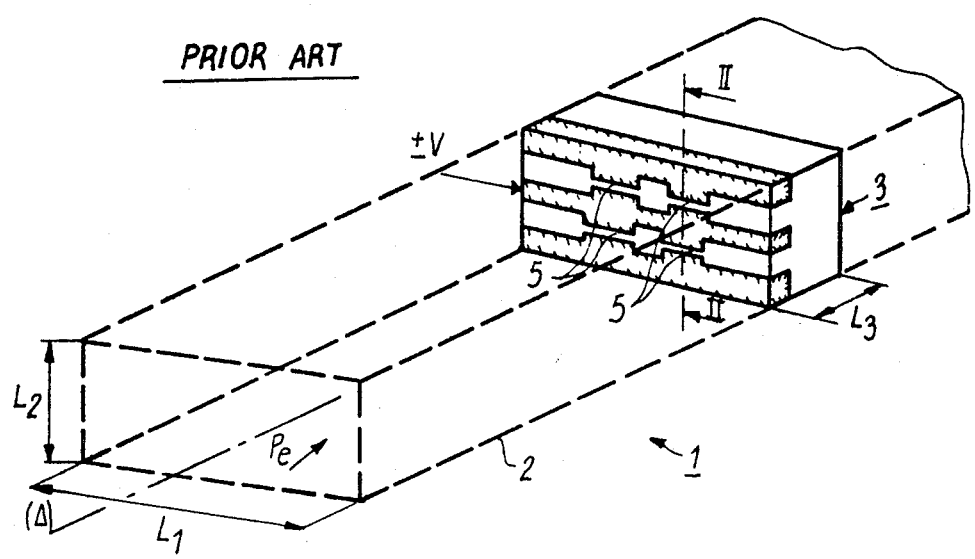
FIG_1
PRIOR ART
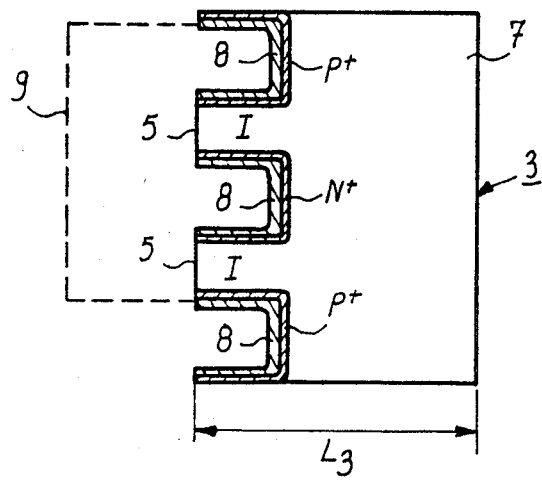
FIG_2
PRIOR ART

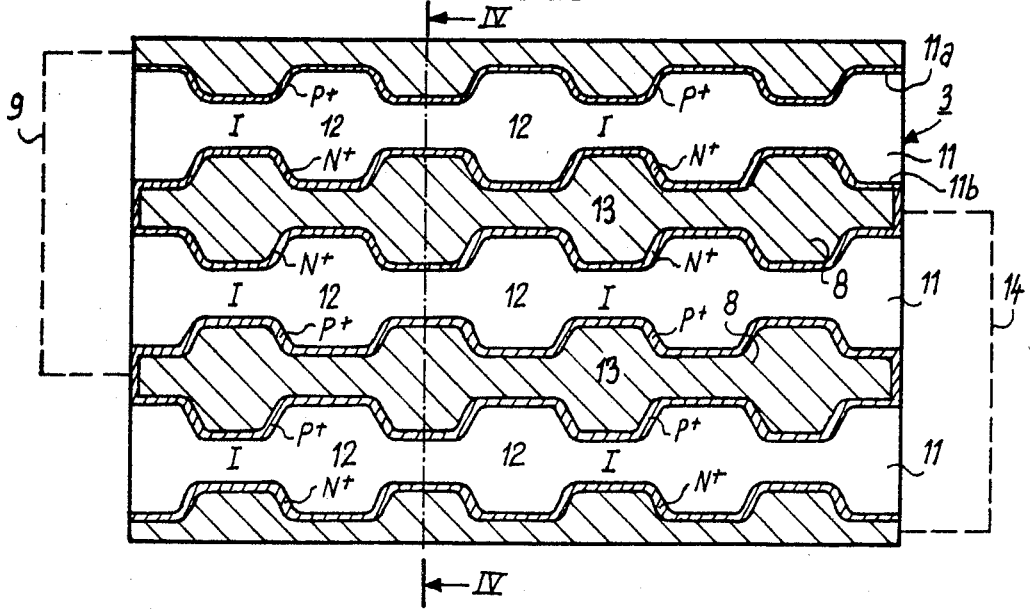
FIG_3
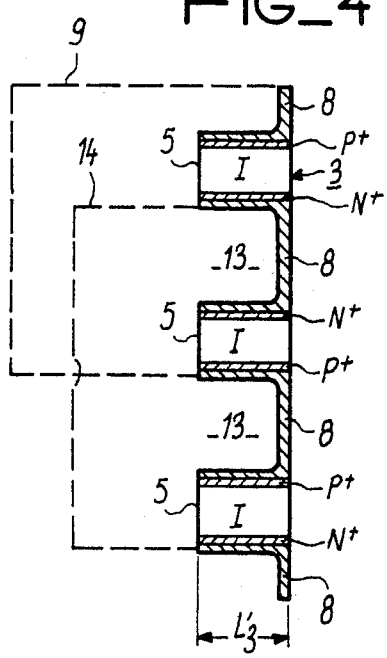
FIG_4

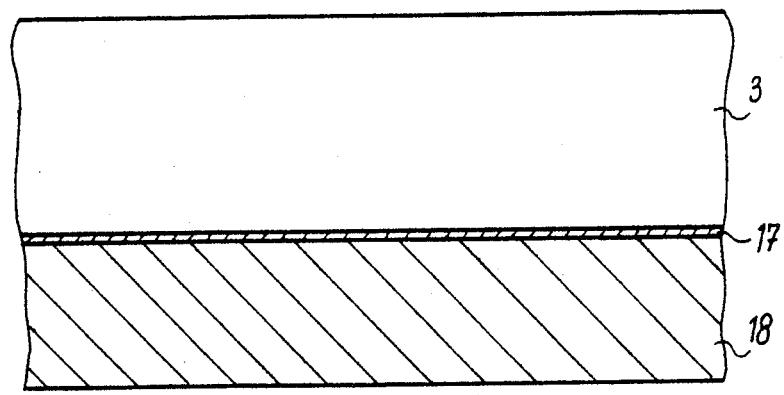
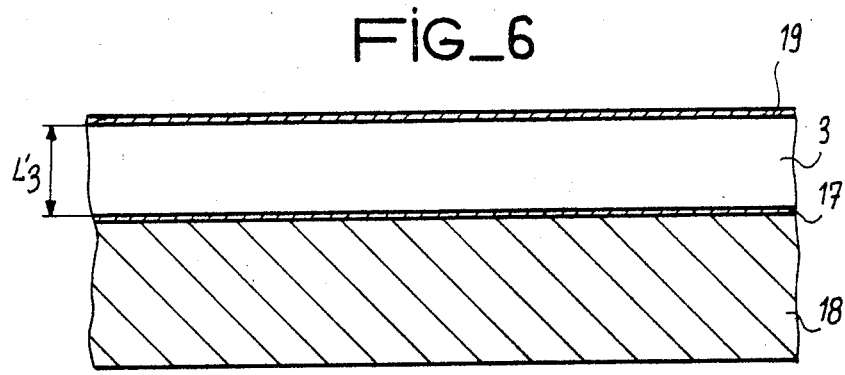
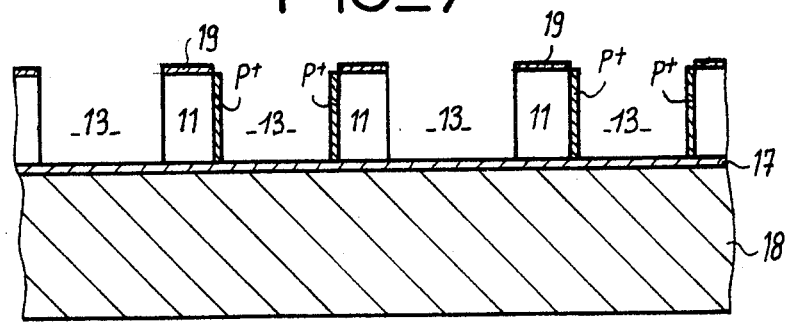

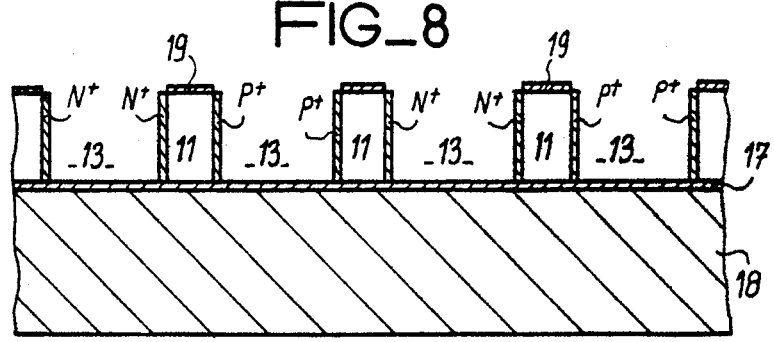
FIG_8
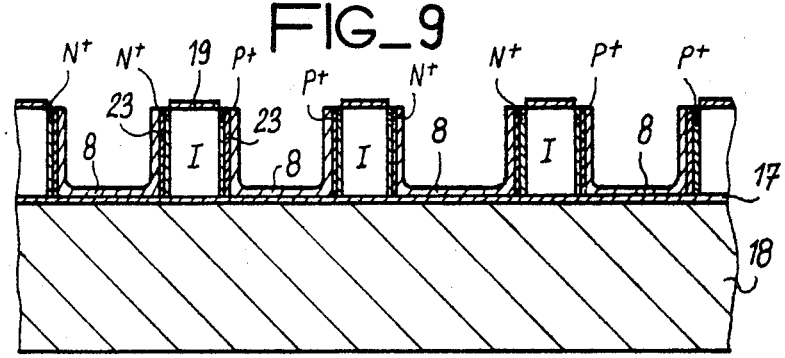
FIG_9
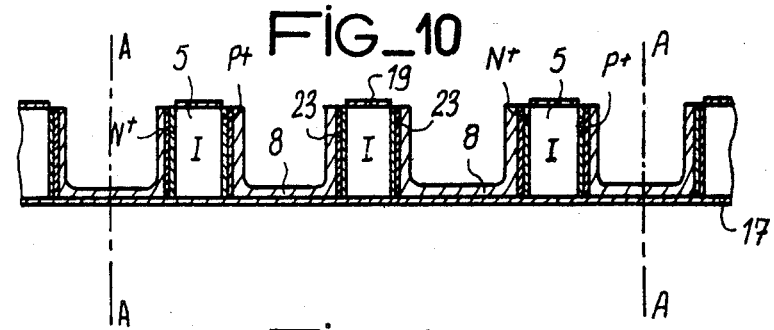
FIG_10
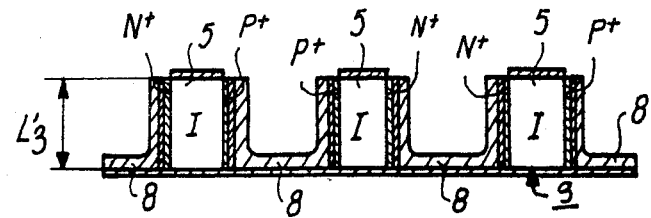
FIG_11

HIGH-POWER WAVEGUIDE LIMITER COMPRISING PIN DIODES FOR MILLIMETER WAVES

BACKGROUND OF THE INVENTION

The present invention relates to a power limiter for the high microwave range, formed from several PIN diodes of the silicon type which are mounted in a waveguide and operate for millimeter waves, as well as to a method of making these diodes.

It will be recalled that the purpose of a device of this kind is to transmit particular microwave signals with a minimum power loss and to separate particular signals from the others.

FIGS. 1 and 2 respectively illustrate a perspective view and a cross-section view along the line II—II of a known structure of a high-power limiter comprising silicon PIN diodes for millimeter waves, as described in the article published in "Microwave Journal", March 1983, pages 65 to 70, entitled "Millimeter wave high power solid state limiter". This limiter 1 is formed by a rectangular metal waveguide 2, having the longitudinal axis $\Delta$, of dimensions permitting the propagation of millimetric waves, and wherein is mounted transversely to the axis $\Delta$ a substrate 3 of silicon in the form of a parallelepipedic strip or blade having a rectangular cross-section of the same dimensions as those of the cross-section of the guide, for example $L_1 = 2.54$ mm and $L_2 = 1.27$ mm.

So that these may withstand a high level of microwave power, several silicon PIN diodes 5 of identical size, for example four in number, are formed in the surface of the substrate 3 in a series-parallel configuration, and are situated facing the input of the incident power $P_e$ to assure limitation of the latter. The silicon substrate 3 has a dimension $L_3$ along the longitudinal axis $\Delta$ of the guide of the order of 100 microns and obstructs a cross-section of the guide 2.

In FIG. 2, the production of the PIN diodes 5 in the surface of the silicon substrate 3 of a thicknesss $L_3$ of the order of 100 microns, is effected initially by acting on this latter in a manner such as to form grooves of a depth of the order of 20 microns, delimiting the intrinsic silicon areas I of the diodes while leaving a deep zone 7 of silicon in parallel on the zones I of the diodes, thus of the order of 80 microns. The action on the substrate is followed by alternate conventional diffusions of the P+ N+ types performed at the level of the grooves, thus forming the P+ and N+ zones of the different diodes produced in this manner. The grooves are then covered with metallizations 8 forming contacts on the alternate P+ and N+ areas of the diodes 5, and two metal bus connectors respectively interconnect the anode and cathode metallizations of the diodes. Only the bus interconnecting the anode metallizations is needed in the example chosen and illustrated in FIG. 2, and is denoted by the pecked lines 9 in this Figure. The PIN diodes 5 are biased by applying an external voltage $\pm V$ (FIG. 1) between the two metal bus connectors.

However, a high power limiter for millimeter waves according to this prior art has disadvantages. In fact, the presence of the silicon zone in parallel with the zones I of the diodes formed in the silicon substrate creates a lagging of the carriers injected into the areas I of the diodes, which appreciably increases the switching period of the millimeter waves being propagated within the waveguide. As a result, these switching PIN diodes cannot be described as fast diodes. Furthermore, this area of silicon situated outside the PIN diodes as such introduces supplementary insertion losses at low level and zero polarization.

SUMMARY OF THE INVENTION

The present invention has as its object to remedy these shortcomings by proposing a high microwave power limiter for millimeter waves which comprises silicon PIN diodes assuring fast switching, and offering excellent overall performance factors as regards insertion losses and isolation.

To this end, the invention provides a high power limiter comprising:
- a rectangular waveguide having a longitudinal axis of dimensions permitting the propagation of millimeter waves;
- a silicon substrate of parallelepipedic form and rectangular cross-section and of substantially the same dimensions as those of the cross-section of the guide, mounted in the guide transversely to its longitudinal axis;
- a series-parallel array of silicon PIN diodes of identical dimensions formed in the surface of the substrate, the diodes being situated facing the input of the power into the guide, and the dimension of the silicon substrate along the longitudinal axis of the waveguide being equal to that of the silicon area I of each of the PIN diodes along this same axis.

Thus, the fact that the substrate has imparted to it a dimension along the longitudinal axis of the guide equal to that of the areas I of the diodes, that is to say eliminating the silicon zone situated outside the actual PIN diodes according to the prior art, renders it possible for the injection of the carriers to be located exclusively within the areas I of the diodes. As a result, the PIN switching diodes are fast diodes which play a part in reducing the insertion losses and isolation of the limiter.

BRIEF DESCRIPTION OF THE DRAWINGS

Other features and advantages of the invention will appear more clearly from the following detailed description illustrated by the accompanying figures which, apart from FIGS. 1 and 2 of the prior art already described, illustrate:

FIG. 3: a view in longitudinal cross-section of the silicon substrate in which are formed the PIN diodes of the limiter in accordance with the invention, FIG. 4: a view in cross-section along the line IV—IV of FIG. 3, and FIGS. 5 to 11: views in cross-section illustrating the different stages of the method for the production of the PIN diodes of the limiter according to the invention.

In these different figures, the same references apply to the same elements and refer back to those already utilized for the same elements of FIGS. 1 and 2 described in the foregoing.

DETAILED DESCRIPTION OF THE PREFERRED EMBODIMENT

In FIGS. 3 and 4, there is illustrated at 3 the silicon substrate of parallelepipedic form and rectangular cross-section intended to be installed transversely to the longitudinal axis of the waveguide 2 of the power limiter 1 as depicted in FIG. 1, and operating in the millimeter wave range, for example at 94 GHz, and at high incident power equal for example to 1 kW.

A matrix of identical silicon PIN diodes 5 is formed in the surface of the substrate 3 in accordance with a series-parallel layout, for example defined by three diodes in series in each of the four columns in parallel, giving twelve diodes altogether. Each of the silicon PIN diodes 5 is formed by an intrinsic area or section of silicon I situated between two doped zones or regions P+ and N+ respectively, and the zone I of each diode 5 is formed flush with the silicon substrate 3.

As is apparent from FIG. 4, the substrate 3 has a dimension $L_3'$ along the longitudinal axis of the waveguide 2 of FIG. 1, equal to that of the zone I of each of the diodes 5, for example 25 microns. This has the advantage of localizing the injection of the carriers within a silicon strip strictly defined by the zones I of the diodes, which considerably improves the switching period since the carriers can no longer incur time-lagging in a silicon zone in parallel with the zones I of the PIN diodes.

By way of illustration, the layer I of each diode 5 has a small thickness, of the order of 5 to 20 microns, and the P+ and N+ layers of each diode are very thin, each being of the order of 2 microns.

In FIG. 3 which illustrates a sectioned front view of the silicon substrate 3, this latter comprises—along its rectangular cross-section—several identical silicon bars 11, numbering three in the selected example of the series-parallel layout of the PIN diodes, arranged parallel to the length of the cross-section of the substrate and throughout the height of this cross-section.

Each silicon bar 11 extends longitudinally throughout the front surface of the substrate, that is to say that intended to receive the power input of the limiter, and comprises two opposed longitudinal edges 11a and 11b which with respect to each other comprise opposed identical crenellations with their corresponding sides slightly sloping, thereby forming alternately shortened and lengthened silicon sections. The shortened or rather constricted parts of each bar 11, numbering four in the selected example of the series-parallel layout of the PIN diodes, form the zones I of the diodes 5, whereas the lengthened or rather enlarged parts of each bar indicated at 12 assure a reduction of the parasitic capacity.

Over the height of the substrate 3, the silicon bars 11 are delimited or separated from each other by grooves 13 each of which longitudinally assumes the crenellated shape of the bars and as a result in each case has a U-shaped form in cross-section as seen in FIG. 4, of which the parallel opposed branches delimit the diodes 5 and of which the bottom is situated at the level of the rear surface of the substrate 3. In FIG. 4, each groove 13 has a depth equal to the dimension $L_3'$ of each PIN diode 5.

The P+ and N+ zones of the diodes 5 are arranged longitudinally and alternately, each extending only over the two opposed walls of one and the same groove 13, that is to say actually over the two opposed edges of one and the same silicon bar 11, thus forming the different silicon PIN diodes 5.

Furthermore, the grooves 13 are covered respectively, by metal layers 8 each of which may for example be formed by a group of subsidiary layers of titanium, platinum and gold, thereby forming metallizations of the alternate P+ and N+ zones of the diodes 5. Moreover, the anode and cathode metallizations 8 of the PIN diodes 5 are all connected respectively to two common junctions or metal bus connectors, for example of gold, and denoted at 9 and 14 by broken lines in FIGS. 3 and 4.

The silicon substrate 3 described in the foregoing and in the surface of which is formed the matrix of PIN diodes 5, is installed in the waveguide 2 of FIG. 1, in a manner such as to obstruct a cross-section of the same, the assembly of the waveguide 2 and PIN diodes 5 formed in the substrate, forming the power limiter indicated at 1 in FIG. 1 and of which the operation is the following.

When the PIN diodes are blocked, the guide may on the one hand be considered as filled with a dielectric substance having a high dielectric constant $\epsilon$ and has such dimensions on the other hand that the propagation of a millimeter wave is possible. In this case, the incident power is transmitted by the limiter with a minimum of losses.

On the contrary, when the PIN diodes are conductive, they are equivalent to a short-circuit and a great proportion of the incident power is reflected by the limiter, thus isolating its output from its input.

A method will now be described with reference to FIGS. 5 to 11, for making or producing silicon PIN diodes in a series-parallel configuration formed in the silicon substrate 3 as illustrated in FIGS. 3 and 4.

According to a preferred embodiment, this method proceeds starting with a pure silicon substrate 3 in the form of a small disc of a thickness of approximately 100 microns, having a high resistivity of the order of 4000 ohm.cm and a diameter such that it is possible to produce a given number of PIN diodes which yield elementary substrates of the kind illustrated in FIGS. 3 and 4, after being cut out in accordance with particular patterns.

The first stage of the method of producing PIN diodes shown in FIG. 5 consists in depositing a barrier layer 17 of a thickness of approximately 1 micron on the silicon substrate 3. This barrier layer may for example be made from silicon oxide $SiO_2$ obtained by thermal oxidization of the silicon substrate. A layer 18 of polycrystalline silicon is then deposited over the barrier layer 17 in a conventional reactor, to a thickness of the order of 100 microns.

This thick layer 18 serves as a mechanical support in order to be able to carry out the second stage of the method which, as illustrated in FIG. 6, consists in reducing the thickness of the silicon substrate 3 to a given thickness $L_3'$ of approximately 25 microns by means of a known and for example mechano-chemical process. A layer 19 of a thickness of approximately 1 micron, for example of silicon oxide $SiO_2$, is then deposited over the considerably reduced silicon substrate 3.

It will be observed that the advantage of the barrier layer 17 deposited between the substrate 3 and the thick layer 18 of polycrystalline silicon resides in that a chemical attack performed subsequently on the rear surface, that is to say an attack on the layer 18 in the direction of the substrate 3, will be stopped at the layer 17.

The following two stages illustrated in FIGS. 7 and 8 consist in alternate conventional diffusions of doped silicon of the P+ and N+ types, making use of a technique applying successive maskings in a manner such as to produce the silicon PIN diodes as such.

To this end, as is apparent from FIG. 7, the silicon substrate reduced in thickness is first acted upon, for example by photogravure, down to the barrier layer 17 in a manner such as to form grooves 13 delimiting identical silicon bars 11. In a plane at right angles to the sectioning plane of FIG. 7, and one with respect to the other, the sidewalls of each groove 13 assume the form of identical opposed crenellations as illustrated in FIG. 3. Consequently, each bar 11 comprises, still in a plane at right angles to the sectioning plane of FIG. 7, alternately contracted and expanded parts as shown in FIG. 3, the contracted parts of each bar forming the areas I of a thickness of the order of 5 to 20 microns, of the future diodes.

An oxidization of all the grooves 13 formed in this manner is then performed, whereupon one in two grooves is de-oxidized and as apparent from FIG. 7, a diffusion of silicon of P+ type is performed on the walls of the de-oxidized grooves, thus forming the P+ sections of a thickness of the order of 2 microns of the future PIN diodes.

The remaining grooves are then de-oxidized, that is to say the grooves which had not been de-oxidized at the time of the P+ type diffusion, and as is apparent from FIG. 8, a diffusion of doped silicon of the N+ type is performed on the walls of the residual grooves once these have been de-oxidized, thus forming the N+ sections, of a thickness of the order to 2 microns of the PIN diodes.

The following stage illustrated in FIG. 9 consists in metallizing all the grooves 13 only at the level of the walls and bottom of each of these, either by photogravure or by a "lift-off" technique, after de-oxidization of the diffused sections P+ and N+. This metallization initially consists in depositing a platinum layer 23 on each P+ and N+ section, and forming platinum silicide by heat treatment, which is intended to form an ohmic contact. This metal coating operation is then completed by successively depositing titanium (for example 500 Å), platinum (for example 1000 Å) and gold (for example 5000 Å) throughout the contour of each groove. The whole of the titanium-platinum-gold deposits has been illustrated by each layer 8 in FIG. 9.

It will be observed that the structure obtained in this manner may be reinforced mechanically by means of an electrolytic growth of gold of each metallization layer 8.

The following stage illustrated in FIG. 10, consists in eliminating the layer 18 of polycrystalline silicon, for example by a chemical action down to the barrier layer 17.

The separations of the different patterns of PIN diodes 5 are then performed by means of square or rectangular cuts made in a conventional manner at the level of the metallizations 8, as denoted by the dash-dotted lines AA in FIG. 10. These cuts are facilitated by producing much wider grooves at the level of the separation as such.

FIG. 11 illustrates an elementary substrate 3 such as shown in FIG. 4 for the power limiter according to the invention, after rectangular cutting out of the matrix of PIN diodes 5 in accordance with the series-parallel configuration defined in the example selected by three diodes in series in each of the four columns in parallel.

In FIG. 11, the thickness $L_3'$ of the silicon substrate 3 therefore corresponds to its dimension along the longitudinal axis of the waveguide, once the substrate is installed transversely in the guide.

What is claimed is:

1. A high-power limiter comprising:
   a rectangular waveguide having a longitudinal axis ($\Delta$), having dimensions permitting propagation of millimeter waves,
   a silicon substrate of parallelepipedic form and rectangular cross-section substantially of the same dimensions as those of the cross-section of the guide, installed in the guide transversely to the longitudinal axis of the same,
   a series-parallel array of silicon PIN diodes of the same dimensions, produced in the surface of the substrate, the diodes being situated facing the input of power into the guide, and the dimension of the silicon substrate along the longitudinal axis ($\Delta$) of the waveguide being equal to that of the silicon area I of each of the PIN diodes along the same axis ($\Delta$).

2. A limiter according to claim 1 wherein the dimension of the silicon area I of each of the PIN diodes along the longitudinal axis ($\Delta$) of the waveguide is of the order of 25 microns.

3. A limiter according to claim 1, wherein the silicon substrate is formed in cross-section by several identical and parallel silicon bars, each having the same length as that of the cross-section of the substrate, and each having two opposed longitudinal edges which have facing towards each other a shape of opposed identical crenellations, thus forming alternately retracted and expanded silicon sections, the retracted sections of the bars forming the zones I of the PIN diodes, and the silicon bars are separated from each other along the height of the cross-section of the substrate by longitudinal grooves following the shape of the bars and each having a dimension along the longitudinal axis ($\Delta$) of the guide equal to that of the area I of each PIN diode along this same axis.

4. A limiter according to claim 3, wherein the P+ and N+ zones of the PIN diodes are each arranged alternately on the two opposed walls of an identical groove separating two silicon bars, the P+ and N+ zones each having a dimension along the longitudinal axis ($\Delta$) of the guide equal to that of the zone I of each of the PIN diodes along this same axis.

5. A limiter according to claim 4, wherein the grooves are respectively coated with metal layers, thus forming contacts on the alternate P+ and N+ zones of the PIN diodes, the metal layers of the P+ zones are all connected to a first common metal connection, and the metal layers of the N+ zones are all connected to a second common metal connection.

* * * * *